United States Patent [19]
Fujino

[11] Patent Number: 5,380,558
[45] Date of Patent: Jan. 10, 1995

[54] METHOD OF MANUFACTURING SHAPED BODY HAVING STRAIGHT STRIPES

[75] Inventor: Takuo Fujino, Akishima, Japan

[73] Assignee: Hoya Corporation, Tokyo, Japan

[21] Appl. No.: 854,581

[22] Filed: Mar. 20, 1992

[30] Foreign Application Priority Data

Mar. 27, 1991 [JP] Japan .................................. 3-63094

[51] Int. Cl.[6] .............................................. C23C 16/00
[52] U.S. Cl. .............................. 427/255.5; 204/192.26; 204/298.11; 427/162; 427/255
[58] Field of Search ...................... 204/192.12, 298.11, 204/192.26; 427/255, 248.1, 255.5, 162, 166

[56] References Cited

U.S. PATENT DOCUMENTS

| | | | |
|---|---|---|---|
| 4,278,528 | 7/1981 | Kuehnle et al. | 204/298.11 |
| 4,303,489 | 12/1981 | Morrison | 204/298.11 X |
| 4,391,034 | 7/1983 | Stuby | 204/298.11 X |
| 4,562,093 | 12/1985 | Mario et al. | 204/298.11 X |
| 4,704,306 | 11/1987 | Nakamura | 204/298.11 X |
| 4,776,868 | 10/1988 | Trotter et al. | 427/162 X |
| 4,988,424 | 1/1991 | Woodward et al. | 204/298.11 X |
| 5,149,415 | 9/1992 | Sugita et al. | 204/298.11 X |
| 5,154,797 | 10/1992 | Bloomquist et al. | 204/298.11 X |

FOREIGN PATENT DOCUMENTS 55-45019  3/1980  Japan .

*Primary Examiner*—Nam Nguyen
*Attorney, Agent, or Firm*—Nixon & Vanderhye

[57] ABSTRACT

In a method of manufacturing a shaped body, the shaped body has a surface on which a plurality of concaves-convexes are formed in parallel relation to each other in the form of straight stripes. The method comprises the steps of:
  (i) projecting a vertical cross-sectional configuration of the shaped body, onto a thin planar plate, with an equal magnification in a horizontal direction and with an enlarged magnification in a vertical direction and, subsequently, boring or opening portions of the thin planar plate corresponding respectively to vertically elongated convex portions of the shaped body, to produce a vapor-deposition mask plate having therein openings;
  (ii) arranging the vapor-deposition mask plate produced by the step (1), on a planar substrate with a predetermined space left therebetween;
  (iii) executing vapor-deposition operation while one of the planar substrate and the vapor-deposition mask plate is fixed and the other is linearly reciprocated at a uniform velocity along a longitudinal direction of the openings, to deposit a vapor-deposition material onto the planar substrate through the openings in the vapor-deposition mask plate.

16 Claims, 8 Drawing Sheets

METHOD OF MANUFACTURING SHAPED BODY HAVING STRAIGHT STRIPES

BACKGROUND OF THE INVENTION

The present invention relates to methods of manufacturing shaped bodies each having straight stripes on a planar substrate and, more particularly, to a method of manufacturing a shaped body such as a filter, a lenticular lens, and a diffraction grating, which are formed of a glass material, or a shaped body suitable as a mold for manufacturing the same.

In recent years, in order to forming integrated circuits in the field of an electronic industry and, in order to manufacture a filter, a lenticular lens, a diffraction grating, and the like in the field of optics, a technique has been required or demanded in which a fine or micro-pattern is formed on a substrate. As a method for processing the substrate, there are (1) a method in which cutting is executed by mechanical processing, (2) a method in which a resist is hardened by exposure to light, and unhardened, unexposed portions are etched by a chemical reagent (photo-lithography), (3) a method in which a substrate is dry-etched directly by an ion beam, and the like.

However, although any of these methods are suitable for formation of a pattern which has vertical steps, such as a pattern in which a cross-sectional configuration is a square, a pattern in which a cross-sectional configuration is a rectangle, and the like, these methods are unsuitable as a method of forming a pattern in the form of straight stripes having gentle slopes or inclinations, such as a pattern in which a cross-sectional configuration is trapezoidal, a pattern in which a cross-sectional configuration is semi-elliptic, a pattern in which a cross-sectional configuration is triangular, and the like.

SUMMARY OF THE INVENTION

It is an object of the invention to provide a method particularly suitable for manufacturing a shaped body having a pattern in the form of straight stripes having gentle inclinations or slopes, although not limited to the pattern mentioned above.

According to the invention, there is provided a method of manufacturing a shaped body, the shaped body having a surface on which a plurality of concaves and convexes are formed in parallel relation to each other in the form of straight stripes, the method comprising the steps of:

(i) projecting a vertical cross-sectional configuration of the shaped body, onto a thin planar plate, with an equal magnification in a horizontal direction and with an enlarged magnification in a vertical direction and, subsequently, boring or opening portions of the thin planar plate corresponding respectively to vertically elongated convex portions of the shaped body, to produce a vapor-deposition mask plate having therein openings;

(ii) arranging the vapor-deposition mask plate produced by the step (i), on a planar substrate with a predetermined space left therebetween;

(iii) executing vapor-deposition operation while one of the planar substrate and the vapor-deposition mask plate is fixed and the other is linearly reciprocated at a uniform velocity along a longitudinal direction of tile openings, to deposit a vapor deposition material onto the planar substrate through the openings in the vapor-deposition mask plate.

Thus, according to the method of the invention, it is possible to easily manufacture the shaped body in the form of the straight stripes, having the gentle inclinations.

DETAILED DESCRIPTION OF THE DRAWINGS

Figure 5A:
Figure 5B:
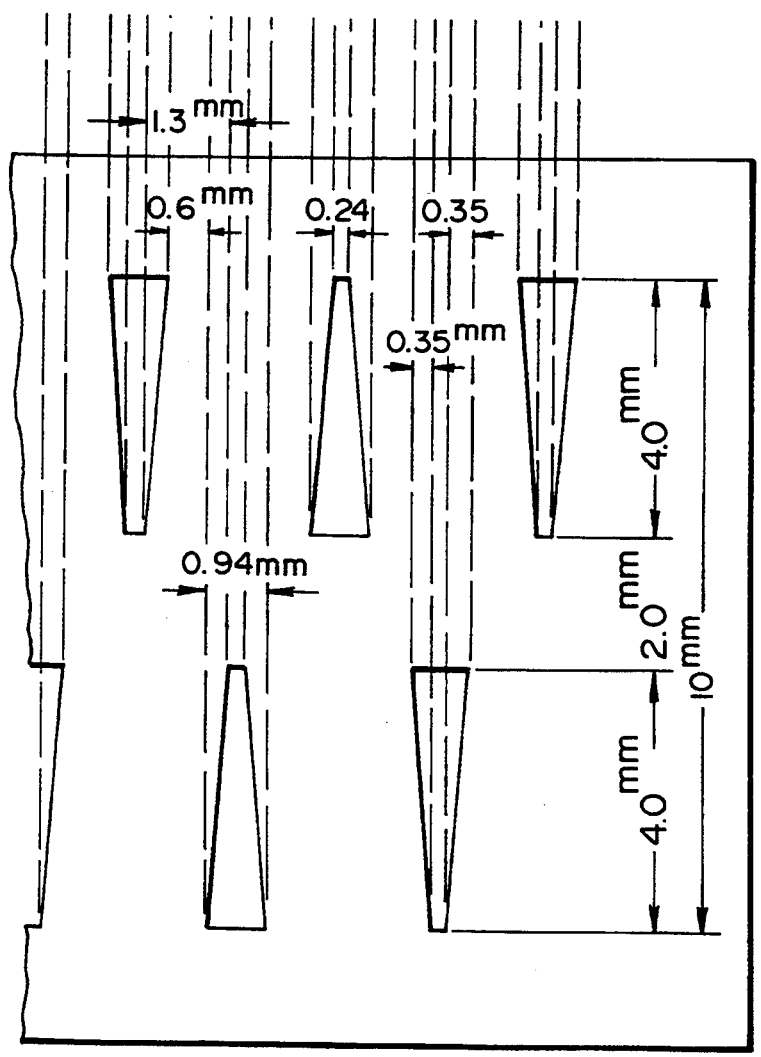
Figure 6A:
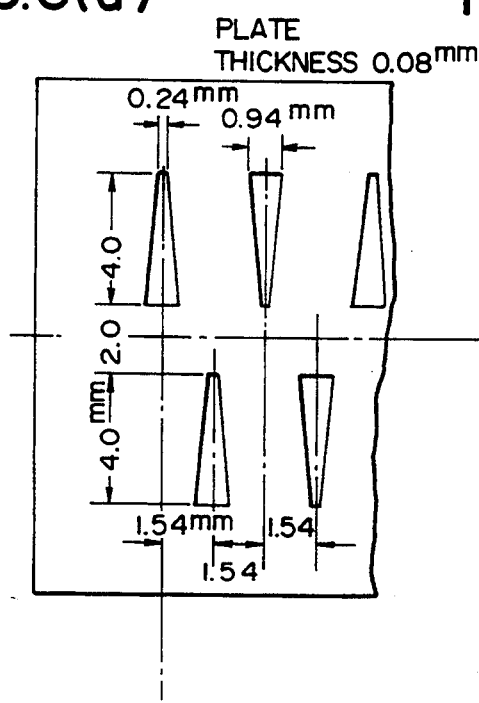
Figure 6C:
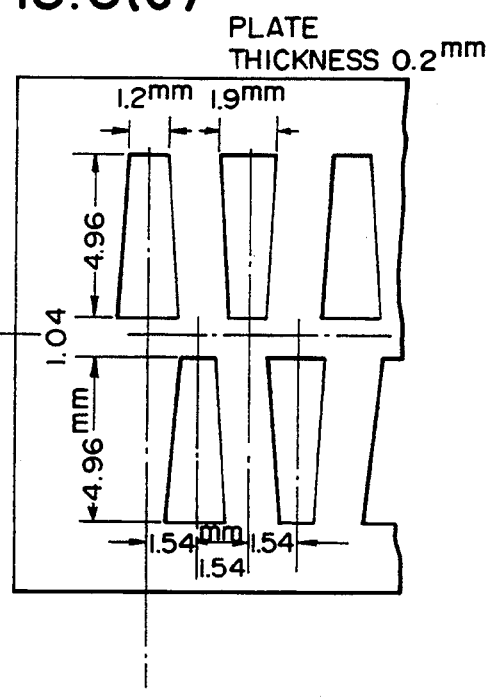
Figure 6B:
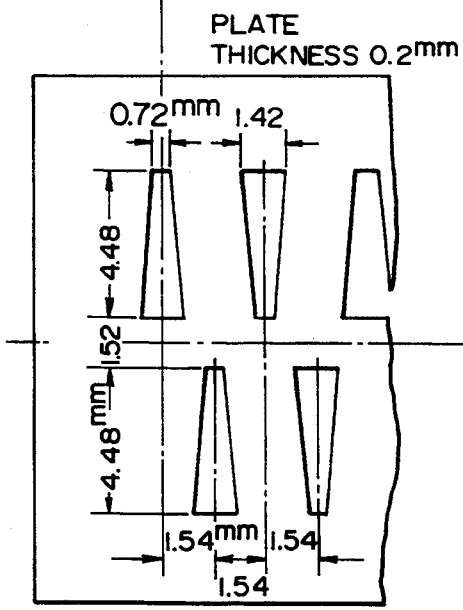
Figure 6D:
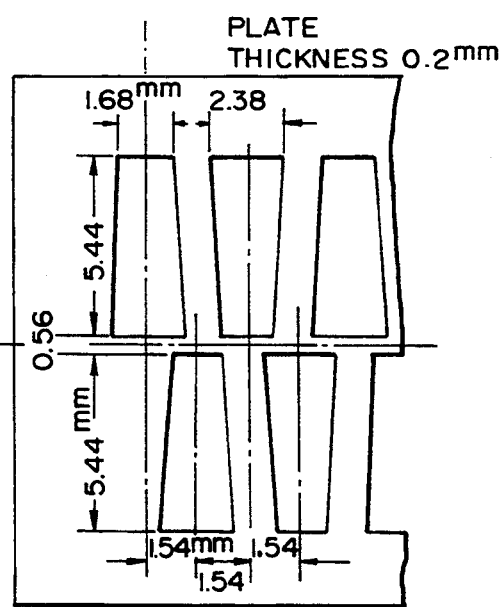
Figure 7A:
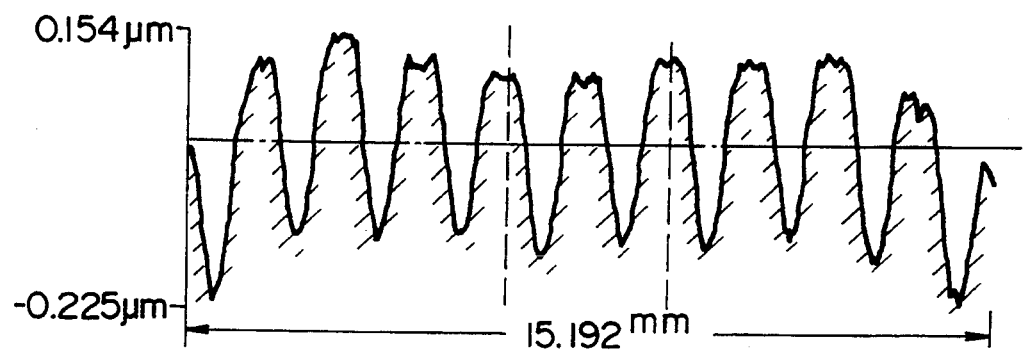
Figure 7B:
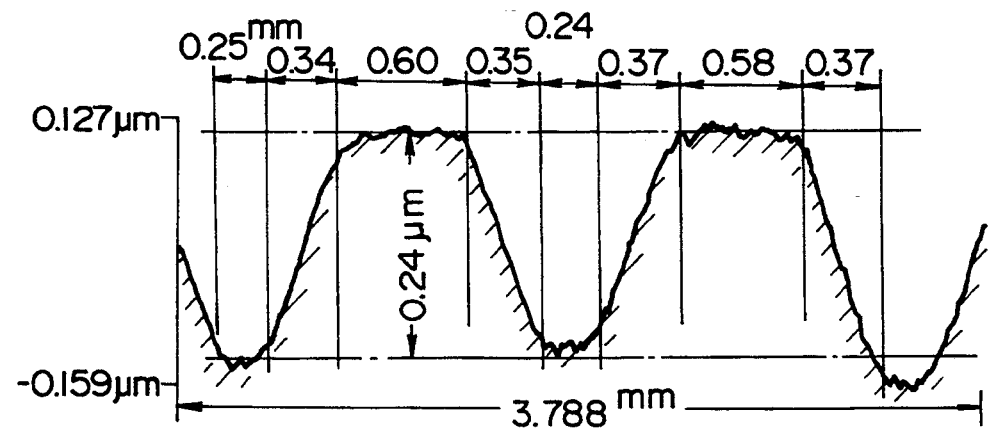
Figure 8A:
Figure 8B:
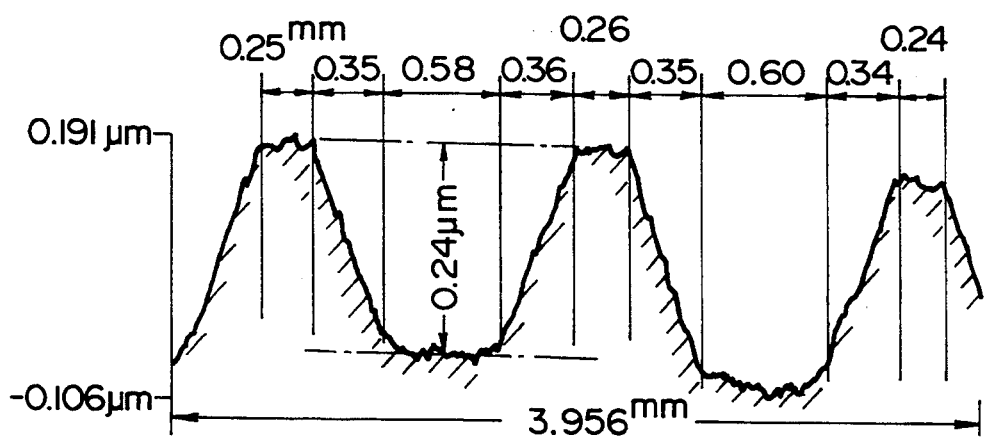

FIGS. 4(a), 4(b), 4(c) and 4(d) are views showing cross-sectional configurations of other respective shaped bodies produced according to the invention;

FIG. 5(a) is a vertical cross-sectional view showing a filter having stripes in which each of convexes has a pair of gentle inclinations in the form of a trapezoidal configuration;

FIG. 5(b) is a top plan view showing a vapor-deposition mask plate for manufacturing a mold used to manufacture the filter illustrated in FIG. 5(a);

FIGS. 6(a), 6(b), 6(c) and 6(d) are four (4) original drawings used for manufacturing a single mask plate;

FIGS. 7(a) and 7(b) are views showing a fact that a glass filter produced by an embodiment 2 has a surface whose concaves and convexes are trapezoidal; and FIGS. 8(a) and (b) are views showing a fact that a mold used for manufacturing the filter illustrated in FIGS. 7(a) and 7(b) has concaves and convexes each of which is a trapezoidal configuration reverse to that illustrated in FIGS. 7(a) and (b).

DESCRIPTION OF THE EMBODIMENTS

The invention will hereunder be described in detail with reference to embodiments illustrated in the drawings.

Embodiment 1

Figure 1A:
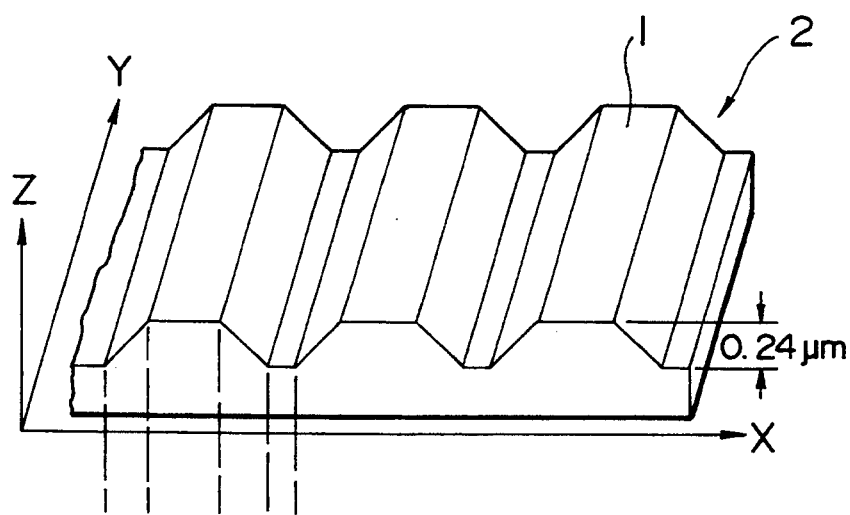
FIG. 1(a) is an exaggerated fragmentary stereoscopic or perspective view showing a glass filter having a straight stripe pattern, in which each of a plurality of convexes is a trapezoid with gentle inclinations.
Figure 1B:
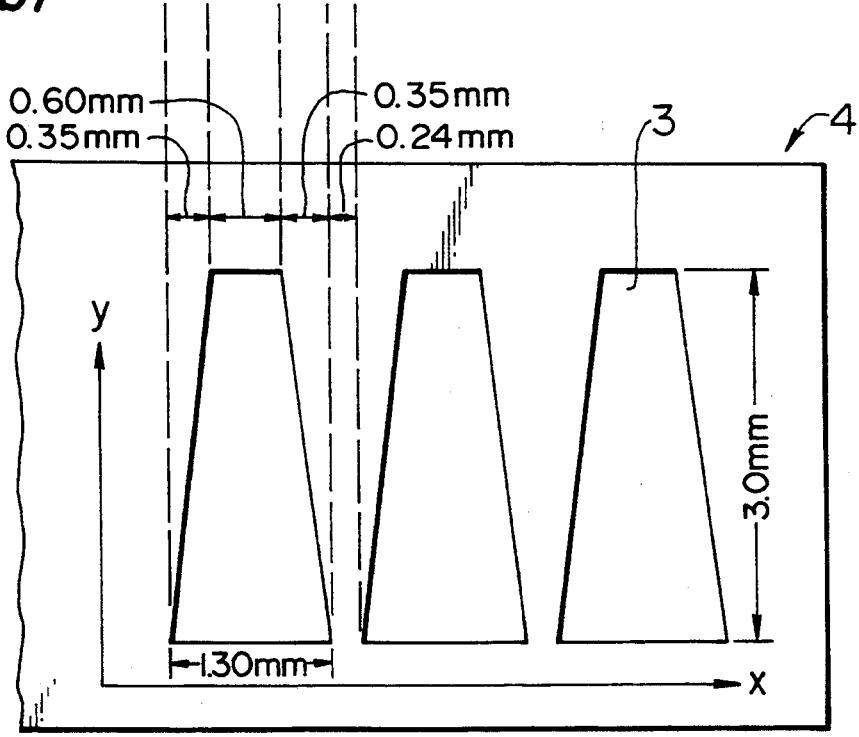
FIG. 1(b) is a top plan view showing a vapor-deposition mask plate in which tile trapezoids illustrated in FIG. 1(a) are projected in enlargement of 12500 times in a longitudinal direction.

A glass-made low-pass filter 2 having straight stripes as illustrated in a telescopic view of FIG. 1(a), is manufactured in which each of convexes 1 is a trapezoid having a pair of gentle inclinations. First, a SUS 304 plate, whose thickness is 5 mm, is used as a thin planar plate, to form a vapor-deposition mask plate 4 having a plurality of trapezoidal openings 3 enlarged longitudinally as shown in FIG. 1(b). Each of these openings 3 has the following configuration. That is, in a cross-section cut along X- and Z-axes illustrated in FIG. 1(a), X is arranged properly with respect to an x-direction, and Z is arranged properly with respect to a y-direction in FIG. 1(b). A horizontal direction in FIG. 1(a) is enlarged with equal or uniform magnification, while a vertical (longitudinal) direction is enlarged y/Z=3.0 mm/0.24 μm=12500 times. An enlarged magnification in the vertical (longitudinal) direction may vary between 1,000 and 1,000,000 times. A length 3.0 mm of a longitudinal dimension of each of the trapezoidal openings 3 relates to a thickness of the vapor-deposited film. Since, however, the vapor-deposited film thickness can be regulated or adjusted also by vapor-deposition time, the longitudinal dimension should properly be predetermined.

As seen in FIG. 1(b), each of the openings 3 has opposite ends with different widths in the vertical direction (axis y). For the particular embodiment illustrated in FIG. 1(b) the width at one end of the leftmost opening 3 is 1.30 mm, while the width at the opposite end thereof in direction y is 0.60 mm.

Figure 2A:
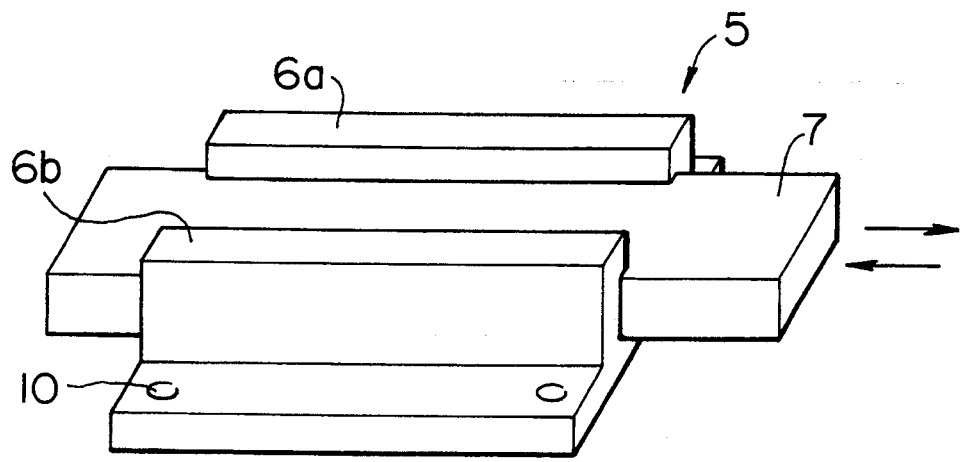
FIG. 2(a) is a perspective view showing a vapor-deposition jig.
Figure 2B:
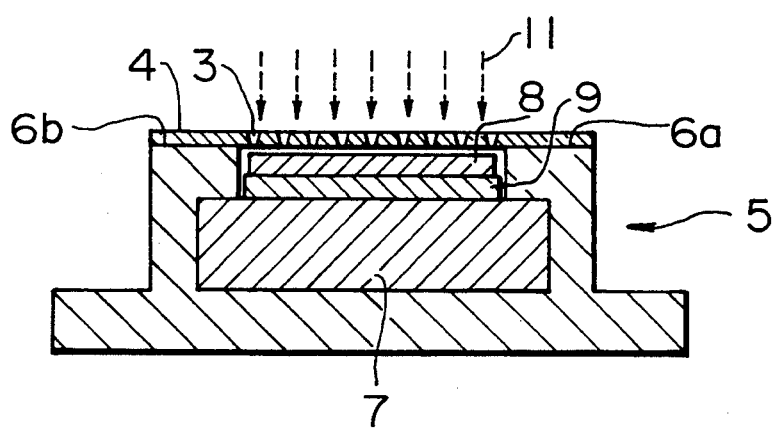
FIG. 2(b) is a cross-sectional view showing a condition under which a planar substrate and the vapor-deposition mask plate are arranged on the vapor-deposition jig illustrated in FIG. 2(a)
Figure 2C:
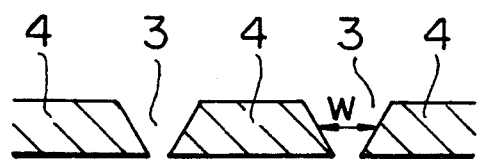
FIG. 2(c) is a partially enlarged cross-sectional view of the vapor-deposition mask plate with opening illustrated in FIG. 2(b)

The vapor-deposition mask plate 4 shown in FIG. 1(b), produced in this manner, is so arranged as to span a pair of surfaces 6a and 6b for attaching the vapor-deposition mask plate 4, of a vapor-deposition jig 5 illustrated in FIG. 2(a), and is fixedly mounted on the vapor-deposition jig 5 by means such as screwing or the like (not shown). At this time, it is necessary that the vapor-deposition mask plate 4 is fixedly mounted such that a direction along which a sample table 7 formed of a carbon plate moves (refer to arrows in FIG. 2(a)) coincides with the longitudinal (vertical) direction (a y-axis direction in FIG. 1(b)) of the openings 3 in the vapor-deposition mask plate 4. On the other hand, as shown in FIG. 2(b), a polished or ground quartz glass disc 8 of 17 mm diameter, 3 mm thickness serving as a planar substrate is mounted on the sample table 7 through an adequate spacer 9, and is fixedly mounted on the sample table 7 by means such as screwing or the like (not shown) with a space between the quartz glass disc 8 and the vapor-deposition mask plate 4 being maintained to 0.1 mm. In this connection, as shown FIG. 2(b), the portions of the vapor-deposition mask plate 4 between openings 3 has a cross-section of a one-side knife or shape edge form. That is, as enlargedly shown in FIG. 2(c), the horizontal width (w) of each opening 3 becomes narrower from top to down in the thickness direction of the plate 4. The vapor-deposition jig 5 illustrated in FIG. 2(b) is suspended from a substrate-attaching surface located at a ceiling within a sputtering chamber with an upper surface of the vapor-deposition jig 5 being directed downwardly, and is screwed through bores 10. In the vapor-deposition jig 5, the sample table 7 formed of a carbon plate is closely fitted within the vapor-deposition jig 5, and the spacer 9 and the quartz glass disc 8 are fixedly mounted on the sample table 7. Accordingly, even if the vapor-deposition jig 5 is suspended with the upper surface illustrated in FIG. 2(b) directed downwardly, a space between the quartz glass disc 8 and the vapor-deposition mask plate 4 is maintained to 0.1 mm. A quartz glass target of 100 mm diameter was mounted on a lower portion within the chamber, and quartz vapor 11 from a target was vapor-deposited on the surface of the quartz glass disc 8 at a predetermined or constant vapor-deposition speed, while the sample table 7 and the quartz glass disc 8 fixedly mounted on the sample table 7 through tile spacer 9 are linearly reciprocated at a constant speed of 23 mm/15 seconds. Here, 23 mm is a distance through which the sample table 7 moves, and is a total length of (3 mm of the longitudinal dimension of each of the openings 3 in the vapor-deposition mask plate 4)+(17 mm of a diameter of the quartz glass disc 8)+(1.5 mm of an allowance between the bottom of the opening 3 and the quartz glass disc 8, prior to movement of the sample table 7)+(1.5 mm of an allowance between the quartz glass disc 8 and the top of the opening 3, after one way movement of the sample table 7). Further, 15 seconds of time required for one way is a value determined in order to obtain a smooth constant speed, and no influence is exerted upon the value regardless of the fact that the speed is faster or slower, if the speed is constant.

Figure 3:
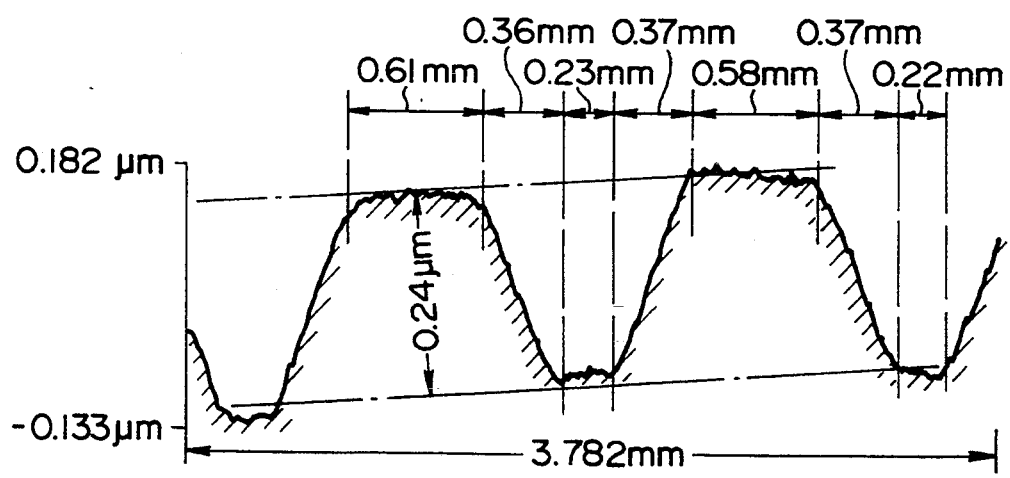
FIG. 3 is a view showing that the glass filter produced by an embodiment 1 has a trapezoidal cross-sectional configuration.
Figure 4A:
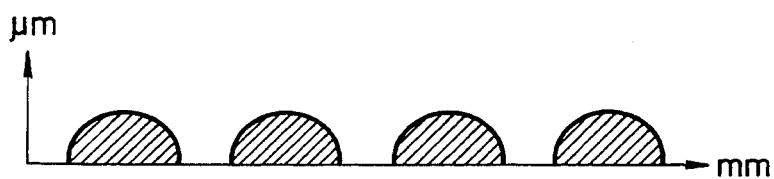
Figure 4B:
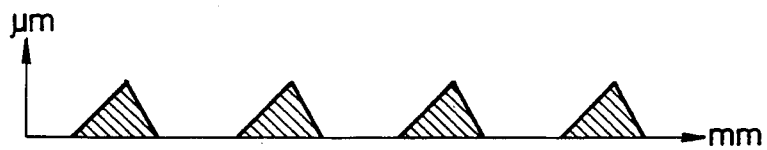
Figure 4C:
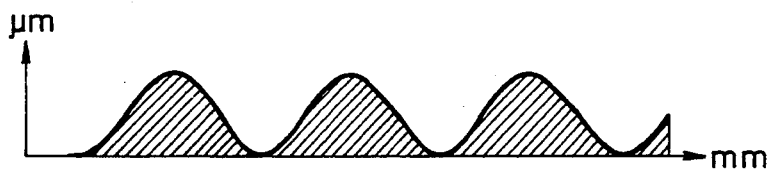
Figure 4D:
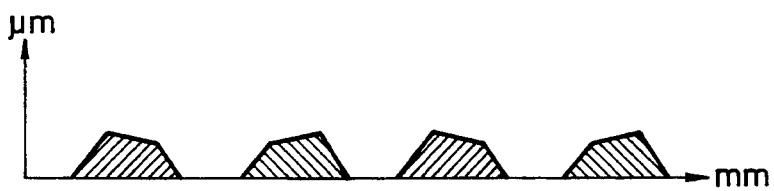

Concaves and convexes on the surface of the disc 8 of 17 mm diameter produced in this manner were measured by a Taylor-Hobson shape measuring device, and there was produced a trapezoid faithful to an objective configuration, as illustrated in FIG. 3. Similar experiments were conducted with changing a space between a quartz glass disc and a vapor-deposition mask plate, and it was found that the concaves and convexes are brought to a straight stripe pattern in which a cross-sectional configuration is substantially trapezoidal if the space is brought to a value equal to or less than 0.5 mm.

In this manner, if the vapor-deposition mask plate having the trapezoidal openings is used, the cross-sectional configuration of the stripe formed on the quartz glass disc 8 is brought also to a trapezoid as intended. Further, the cross-sectional configuration is not necessarily limited to the trapezoid, but the embodiment 1 is applicable to various wide cross-sectional configurations such as a semi-elliptical cross-sectional configuration (FIG. 4(a)), a triangular cross-sectional configuration (FIG. 4(b)), or a Sin-curve configuration (FIG. 4(c)), or a configuration (FIG. 4(d)) in which left- and right-hand inclinations are different from each other. As other modifications or applied examples, the embodiment 1 is applicable to a Fresnel lens if a planar substrate is rotated about its own axis, and to formation of an aspherical lens if bores corresponding to a desired aspherical form are formed through a spherical mask having a radius the same as that of the spherical lens.

Embodiment 2

Similarly to the embodiment 1, an embodiment 2 has an object to form a glass-made low-pass filter illustrated in FIG. 1(a). However, in the case where a large number of identical articles are manufactured, it is far effective that a glass mold reverse in configuration of the concaves and convexes to the embodiment 1 is formed, and the glass mold is used to form the articles by press molding.

Openings formed in a vapor-deposition mask plate reverse in concaves and convexes to a glass filter illustrated in FIG. 5(a) are illustrated in FIG. 5(b). In the embodiment 1, since the openings formed in the vapor-deposition mask plate are arranged in a single horizontal row, warping occurs or is formed in the plate as tile number of uses increases. Here, accordingly, the openings are arranged in two rows and are turned through 180 degrees every one. Furthermore, in the embodiment 2, since it is difficult in view of processing to form the one-side knife or sharp edge on the mask by machine processing like the embodiment 1, and accuracy is also difficult to be raised. Accordingly, as shown in FIG. 6, four (4) thin SUS 304 plates (a), (b), (c) and (d) through which openings were formed by chemical etching were prepared. They were aligned while coinciding the centers of the openings with each other, and were pasted together in order of FIG. 6(a)→FIG. 6(b)→FIG.

$6(c) \rightarrow$ FIG. $6(d)$. Thus, a mask having a thickness of approximately 0.7 mm was manufactured which has a knife or sharp edge of 45 degrees macrotically, although the inner surfaces of the openings have steps. FIGS. $6(a)$, $6(b)$, $6(c)$ and $6(d)$ are original views at the time prior to pasting together at that time.

As a base material of the mold, a disc type sample of 17 mm diameter and 3 mm thickness was used in which SiC was deposited densely to a thickness of 0.5 mm on one side of a sintered SiC (silicon carbide) disc by a CVD (chemical vapor deposition) method. The deposited SiC layer was mirror-polished. A space between the disc type sample and the vapor-deposition mask plate was brought to 0.06 mm. The quartz glass target of the embodiment 1 was replaced by an SiC target. Vapor deposition was executed while the sample table moved through 30 mm {(mold diameter: 17 mm)+(ends to ends of the openings arranged in two rows: 10 mm)+(allowances at both ends: 1.5 mm×2)}. In this manner, a mold having concaves and convexes was produced. This mold was used with a planar disc having a smooth surface to form a mold assembly. Hot pressing was executed after putting a glass plate having a refractive index of 1.52 between the two molds. Prior to the pressing, a mold release-film of hard carbon was coated on respective surfaces of the two molds by a sputter method so as to have a film thickness of approximately 600 Angstroms, so that the glass and the molds were not fused to each other. The pressing was executed within nitrogen atmosphere off 600° C. for 60 seconds at pressure of 20 kgf/cm².

Produced press articles have such excellent concave-convex property as requested. A concave-convex measurement result of the produced press articles is shown in FIG. $7(a)$. An enlarged view of a portion of FIG. $7(a)$ is shown in FIG. $7(b)$. Further, a concave-convex measurement result of the mold used for the production of the press articles is shown in FIG. $8(a)$. An enlarge view of a portion of FIG. $8(a)$ is shown in FIG. $8(b)$. In the produced press articles, variations in height and width of mountains were within 5% and 10%, respectively, of designed values. The produced press articles has an approximately same concave-convex property as the article obtained in embodiment 1 in which the article is directly produced without using a mold.

In the embodiments 1 and 2, the vapor-deposition mask plate is fixed, while the planar substrate is reciprocated. However, the planar substrate may be fixed, while the vapor-deposition mask plate may be reciprocated.

While the invention has been herein shown and described in what is presently conceived to be the most practical embodiments thereof, it will be appreciated by those in the art that many modifications may be made thereof within the scope of the invention, which scope is to be accorded the broadest interpretation of the appended claims so as to encompass all equivalent methods and procedures.

What is claimed is:

1. A method of manufacturing a shaped body, said shaped body having a surface on which a plurality of concaves and convexes are formed in parallel relation to each other in the form of straight stripes, said method comprising the steps of:
    (i) projecting a vertical cross-sectional configuration of said shaped body, onto a thin planar plate, with an equal magnification in a horizontal direction and with an enlarged magnification of 1,000–1,000,000 times in a vertical direction and, subsequently, boring or opening portions of said thin planar plate corresponding respectively to vertically elongated convex portions of said shaped body, to produce a vapor-deposition mask plate having therein openings, each of said openings having opposite ends with different widths in the vertical direction;
    (ii) arranging said vapor-deposition mask plate produced by said step (i), on a planar substrate with a predetermined space left therebetween; and
    (iii) executing vapor-deposition operation while one of said planar substrate and said vapor-deposition mask plate is fixed and the other is linearly reciprocated at a uniform velocity along the vertical direction of said openings, to deposit a vapor-deposition material onto said planar substrate through said openings in said vapor-deposition mask plate.

2. A method according to claim 1, wherein, in said step (11), said vapor-deposition mask plate is arranged in parallel relation to said planar substrate with said space at most 0.5 mm left therebetween.

3. A method according to claim 1, wherein said shaped body is selected from the group consisting of a filter, a lenticular lens, a diffraction grating, each of which is formed of glass material, and a mold which is used for manufacturing the same.

4. A method according to claim 1, wherein said shaped body is a glass-made low-pass filter having a straight stripe pattern, and wherein said shaped body has a plurality of convexes each of which is a trapezoid having a pair of inclinations.

5. A method according to claim 4, wherein said vapor-deposition mask plate is a SUS 304 plate whose thickness is 5 mm.

6. A method according to claim 1, wherein each of said openings in said vapor-deposition mask plate has a cross-section of a one-side knife or sharp edge form.

7. A method according to claim 1, wherein said planar substrate is a polished quartz glass disc.

8. A method according to claim 1, wherein quartz vapor is deposited on a surface of said planar substrate at a constant vapor-deposition speed.

9. A method according to claim 1, wherein the concaves and convexes are brought to a straight stripe pattern in which a cross-sectional configuration is substantially trapezoidal.

10. A method according to claim 1, wherein said stripe has a cross-sectional configuration which is a semi-elliptical cross-sectional configuration.

11. A method according to claim 1, wherein said stripe has a cross-sectional configuration which is a triangular cross-sectional configuration.

12. A method according to claim 1, wherein said stripe has a cross-sectional configuration which is a sine-curve configuration.

13. A method according to claim 1, wherein said stripe has a cross-sectional configuration which is a configuration in which left- and right-hand inclinations are different from each other.

14. A method according to claim 1, wherein said openings formed through said vapor-deposition mask plate are arranged in a single horizontal row.

15. A method according to claim 1, wherein said openings are arranged in two rows and are turned through 180 degrees every one.

16. A method according to claim 1, wherein said vapor-deposition mask plate includes a plurality of thin plates through each of which openings are formed by chemical etching.

* * * * *